US012328836B2

(12) United States Patent
Leung et al.

(10) Patent No.: US 12,328,836 B2
(45) Date of Patent: Jun. 10, 2025

(54) SELF-ACTUATING PROTECTIVE COVER DEVICE FOR CONNECTORS OF A FIELD-REPLACEABLE UNIT

(71) Applicant: Juniper Networks, Inc., Sunnyvale, CA (US)

(72) Inventors: Jimmy Chun-Chuen Leung, Fremont, CA (US); Franklin Demick Boyden, Pleasanton, CA (US); Sean Kim, Saratoga, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 422 days.

(21) Appl. No.: 17/658,199

(22) Filed: Apr. 6, 2022

(65) Prior Publication Data

US 2023/0328913 A1 Oct. 12, 2023

(51) Int. Cl.
*H05K 7/14* (2006.01)
*H05K 7/16* (2006.01)

(52) U.S. Cl.
CPC ............. *H05K 7/1487* (2013.01); *H05K 7/16* (2013.01)

(58) Field of Classification Search
CPC .......... H05K 7/1487; H05K 7/06; H05K 7/16; H01R 13/4532
See application file for complete search history.

(56) References Cited

U.S. PATENT DOCUMENTS

| | | | | |
|---|---|---|---|---|
| 2,278,280 A | * | 3/1942 | Pfeiffer | F27D 11/00 439/138 |
| 4,176,897 A | * | 12/1979 | Cameron | H01R 13/44 439/138 |
| 4,352,492 A | * | 10/1982 | Smith | A63F 13/95 439/138 |
| 4,772,214 A | * | 9/1988 | Stoegmueller | H01R 13/4534 439/138 |

(Continued)

FOREIGN PATENT DOCUMENTS

EP 0303475 A1 2/1989

OTHER PUBLICATIONS

Extended European Search Report for Application No. EP22174675. 3, mailed on Oct. 31, 2022, 10 pages.

*Primary Examiner* — Neil Abrams
(74) *Attorney, Agent, or Firm* — Harrity & Harrity, LLP (57) ABSTRACT

A field-replaceable unit (FRU) includes a self-actuating protective cover device that includes: a protective cover, a housing component that includes a slot, a driving link component attached to the protective cover and the housing component, a supporting link component attached to the protective cover and the housing component, and an engagement component attached to the driving link component, wherein the engagement component is to be engaged by an actuation component of a mating connector and caused to move within the slot of the housing component, and the engagement component is to cause the driving link component, the supporting link component, and the protective (Continued)

cover to move when the engagement component moves within the slot of the housing component. The protective cover is to be positioned over one or more connectors of the FRU when the engagement component is positioned at an unengaged position within the slot of the housing component.

20 Claims, 8 Drawing Sheets

(56) References Cited

U.S. PATENT DOCUMENTS

| | | | | |
|---|---|---|---|---|
| 4,796,159 | A * | 1/1989 | Miksche | H05K 7/1454 |
| | | | | 361/796 |
| 4,959,020 | A * | 9/1990 | Di Rosa | H01R 13/631 |
| | | | | 439/138 |
| 5,086,336 | A * | 2/1992 | Murasawa | G06K 19/077 |
| | | | | 257/679 |
| 5,413,510 | A * | 5/1995 | Taylor | H01R 24/66 |
| | | | | 439/138 |
| 5,716,224 | A * | 2/1998 | Masuda | H01R 13/4536 |
| | | | | 439/138 |
| 5,885,095 | A * | 3/1999 | Cohen | H01R 12/7005 |
| | | | | 439/138 |
| 6,454,580 | B1 * | 9/2002 | Hwang | H01R 12/7029 |
| | | | | 439/138 |
| 6,685,362 | B2 * | 2/2004 | Burkholder | G02B 6/3849 |
| | | | | 439/607.34 |
| 6,877,999 | B2 * | 4/2005 | Hashimoto | H01R 13/4532 |
| | | | | 439/138 |
| 7,077,670 | B2 * | 7/2006 | Suwa | G06K 13/0875 |
| | | | | 439/138 |
| 7,140,892 | B2 * | 11/2006 | Takeuchi | H01R 13/6583 |
| | | | | 439/138 |
| 10,290,967 | B2 * | 5/2019 | Morral Marti | H01R 13/4534 |
| 10,700,466 | B2 * | 6/2020 | Brodsky | H01R 13/4538 |
| 10,840,643 | B1 * | 11/2020 | Jin | H01R 12/722 |
| 11,006,543 | B2 * | 5/2021 | Huangfu | H05K 5/03 |
| 11,721,926 | B2 * | 8/2023 | Kozono | H01R 13/4532 |
| | | | | 439/139 |
| 2004/0224544 | A1 | 11/2004 | Suwa et al. | |
| 2022/0071051 | A1 | 3/2022 | Chang et al. | |

* cited by examiner

SELF-ACTUATING PROTECTIVE COVER DEVICE FOR CONNECTORS OF A FIELD-REPLACEABLE UNIT

BACKGROUND

One or more field-replaceable unit (FRU) may be installed in a chassis of a network system (e.g., a network system router) to facilitate communication among computing devices within a network. An FRU is typically a modular device that is removable by a user (e.g., a network administrator) in the field. An FRU may include, for example, one or more power supplies, uplink modules, transceivers, fan trays, packet forwarding engines, routing engines, and/or switching modules.

SUMMARY

In some implementations, an FRU includes one or more connectors; and a self-actuating protective cover device that includes: a protective cover to protect the one or more connectors when the protective cover is positioned over the one or more connectors, a housing component that includes a track and a slot, wherein: the track is to allow movement of an end of an actuation component within the track, and the slot is to allow movement of an engagement component within the slot, a driving link component, wherein: a first end of the driving link component is attached to a first end of the protective cover, and a second end of the driving link component is attached to the housing component of the FRU, a supporting link component, wherein: a first end of the supporting link component is attached to a second end of the protective cover, and a second end of the supporting link component is attached to the housing component of the FRU, and the engagement component, wherein: the engagement component is to move within the slot of the housing component when the end of the actuation component moves within the track of the housing component and contacts the engagement component, the engagement component is attached to a portion of the driving link component, and the engagement component is to cause the driving link component, the supporting link component, and the protective cover to move when the engagement component moves within the slot of the housing component.

In some implementations, an FRU includes a self-actuating protective cover device that includes: a protective cover, a housing component that includes a slot, a driving link component attached to the protective cover and the housing component, a supporting link component attached to the protective cover and the housing component, and an engagement component attached to the driving link component, wherein: the engagement component is to move within the slot of the housing component, and the engagement component is to cause the driving link component, the supporting link component, and the protective cover to move when the engagement component moves within the slot of the housing component.

In some implementations, a self-actuating protective cover device for an FRU includes a protective cover; a housing component that includes a slot; and an engagement component, wherein: the engagement component is to move within the slot of the housing component, and the engagement component is to cause the protective cover to move when the engagement component moves within the slot of the housing component.

DETAILED DESCRIPTION

The following detailed description of example implementations refers to the accompanying drawings. The same reference numbers in different drawings may identify the same or similar elements.

An FRU includes one or more connectors for connecting to other components of a network system chassis. For example, the FRU includes one or more electrical connectors for connecting to electrical connectors of physical interface cards (PICs) and/or flexible PIC concentrators (FPCs) of the network system chassis. From time to time, the FRU needs to be removed from the network system chassis, such as to service the FRU and/or to modify hardware components of the FRU. Accordingly, a user (e.g., a network administrator) physically removes the FRU from the network system and thereby exposes the one or more connectors of the FRU to an environment external to the network system chassis. However, the one or more connectors are delicate components that are susceptible to damage from dust, debris, humidity, or other contaminants, and/or mishandling by the user. Consequently, the one or more connectors are often damaged when the FRU is removed from the network system, which impacts a performance of the one or more connectors, the FRU, and the network system chassis. In some cases, the user may place a plastic cover over the one or more connectors (e.g., after removing the FRU from the network system chassis), but the plastic cover is easily forgotten, misplaced, or lost, and therefore the one or more connectors often remain unprotected and susceptible to damage.

Some implementations described herein provide a self-actuating protective cover device for an FRU. The self-actuating protective cover device includes a protective cover that is attached to a driving link component and a supporting link component, which are connected to a housing component. The housing component includes a slot within which an engagement component (e.g., a pin or a track-roller) moves (e.g., slides). The engagement component is attached to the driving link component. Accordingly, when the engagement component is in an unengaged position within the slot, the engagement component causes the protective cover to be positioned over connectors of the FRU (e.g., causes the protective cover to be in a closed position to protect the connectors). Moreover, when the engagement component is in a fully engaged position within the slot, the engagement component causes the protective cover to not be positioned over the connectors (e.g., causes the protective cover to be in an open position), such as to allow the connectors to connect to a network system chassis. In some implementations, the self-actuating protective cover device may include a spring component that causes the engagement component to remain in the unengaged position (and thereby cause the protective cover to be positioned over the connectors in the closed position to protect the connectors) until the engagement component is moved by an actuation component.

The actuation component may be a "card guide" or other guide structure for inserting the FRU into the network system chassis. An end of the actuation component inserts into a track of the housing component. Accordingly, the end of the actuation component contacts the engagement component (e.g., in the unengaged position within the slot) and pushes the engagement component to the fully engaged position within the slot. This causes the protective cover to cease covering the connectors of the FRU (e.g., causes the protective cover to be in the open position) and thereby allows the connectors to connect to the network system chassis.

In this way, the self-actuating protective cover device causes the protective cover to automatically cover the connectors of the FRU any time the FRU is physically removed from the network system chassis (e.g., when the end of the actuation component ceases to contact the engagement component), such as by a user (e.g., a network administrator). This reduces a likelihood that the components are damaged by exposure to dust, debris, humidity, or other contaminants, and/or mishandling by the user, while the FRU is removed from the network system chassis. Accordingly, this improves a performance of the connectors, the FRU, and the network system chassis (e.g. after the FRU is reinstalled in the network system chassis) as compared to a performance provided by an FRU with damaged connectors. Additionally, because the self-actuating protective cover device is part of the FRU, the self-actuating protective cover device is always available to cause the protective cover to automatically cover the connectors of the FRU whenever the FRU is physically removed from the network system chassis. This further reduces a likelihood that the components are damaged because the connectors are protected regardless of whether the user remembers to manually attach (and correctly attach) a separate cover on the connectors of the FRU.

Figure 1A:
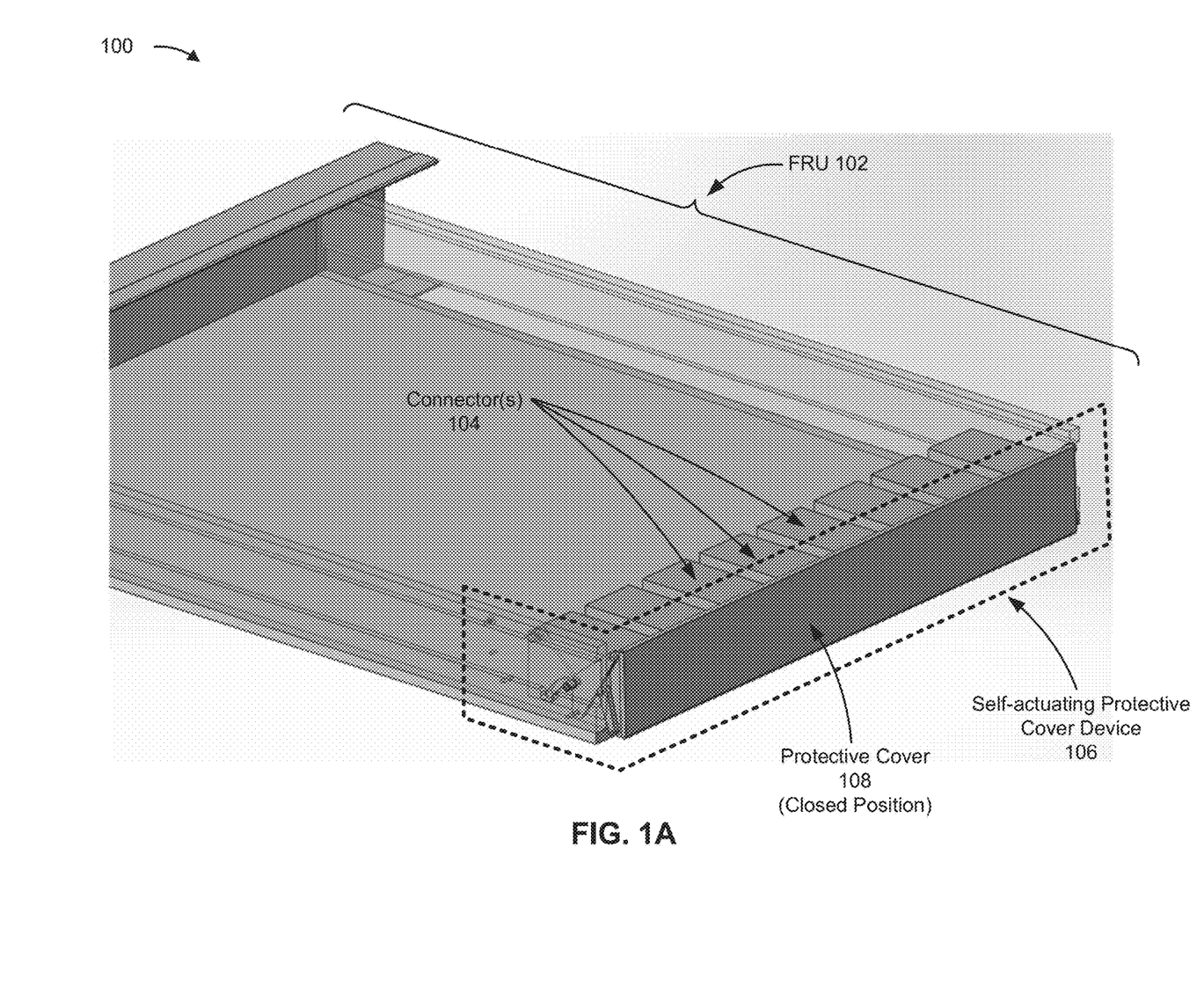
FIGS. 1A-1C are diagrams of one or more example implementations described herein.
Figure 1B:
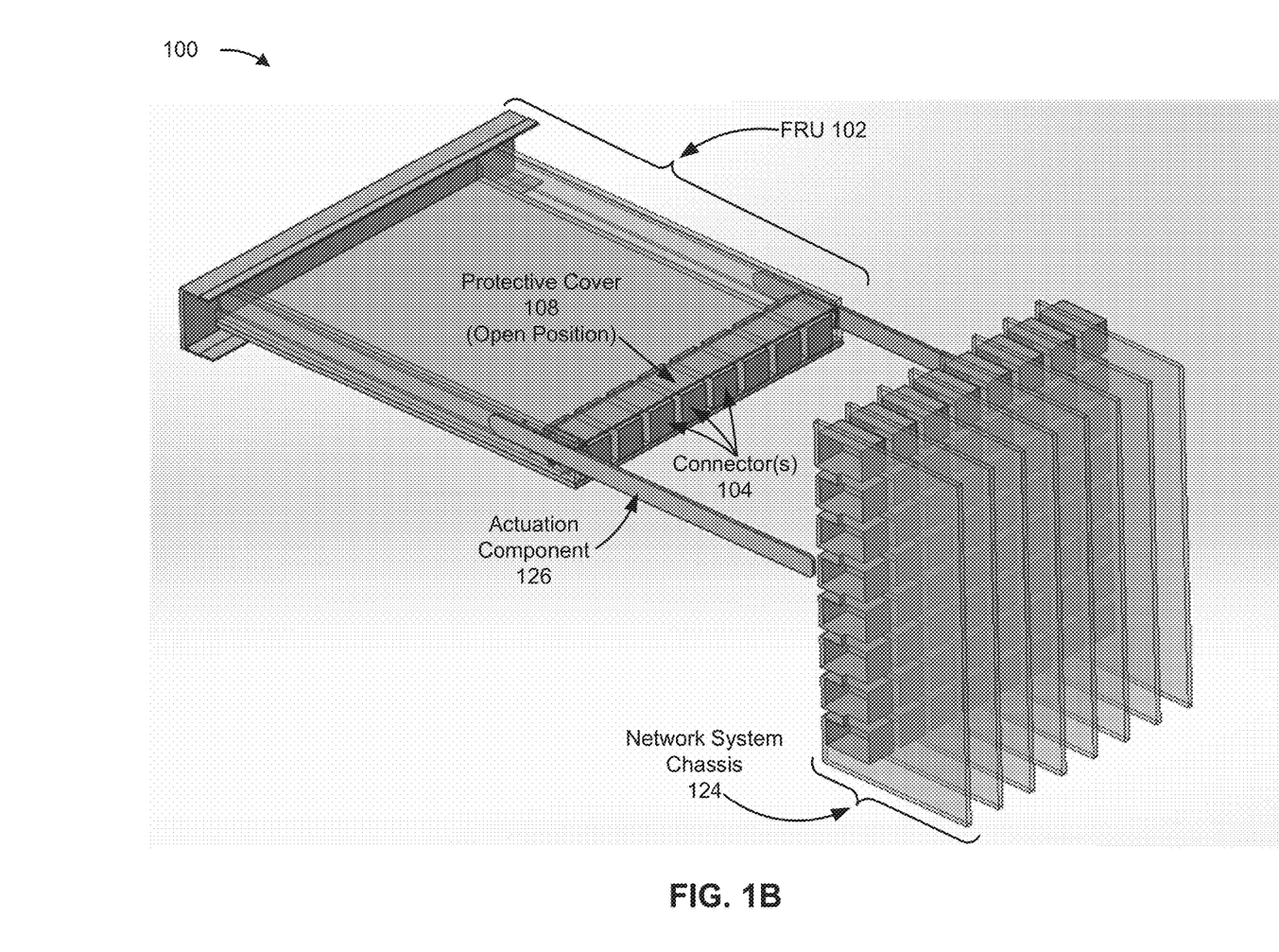
Figure 1C:
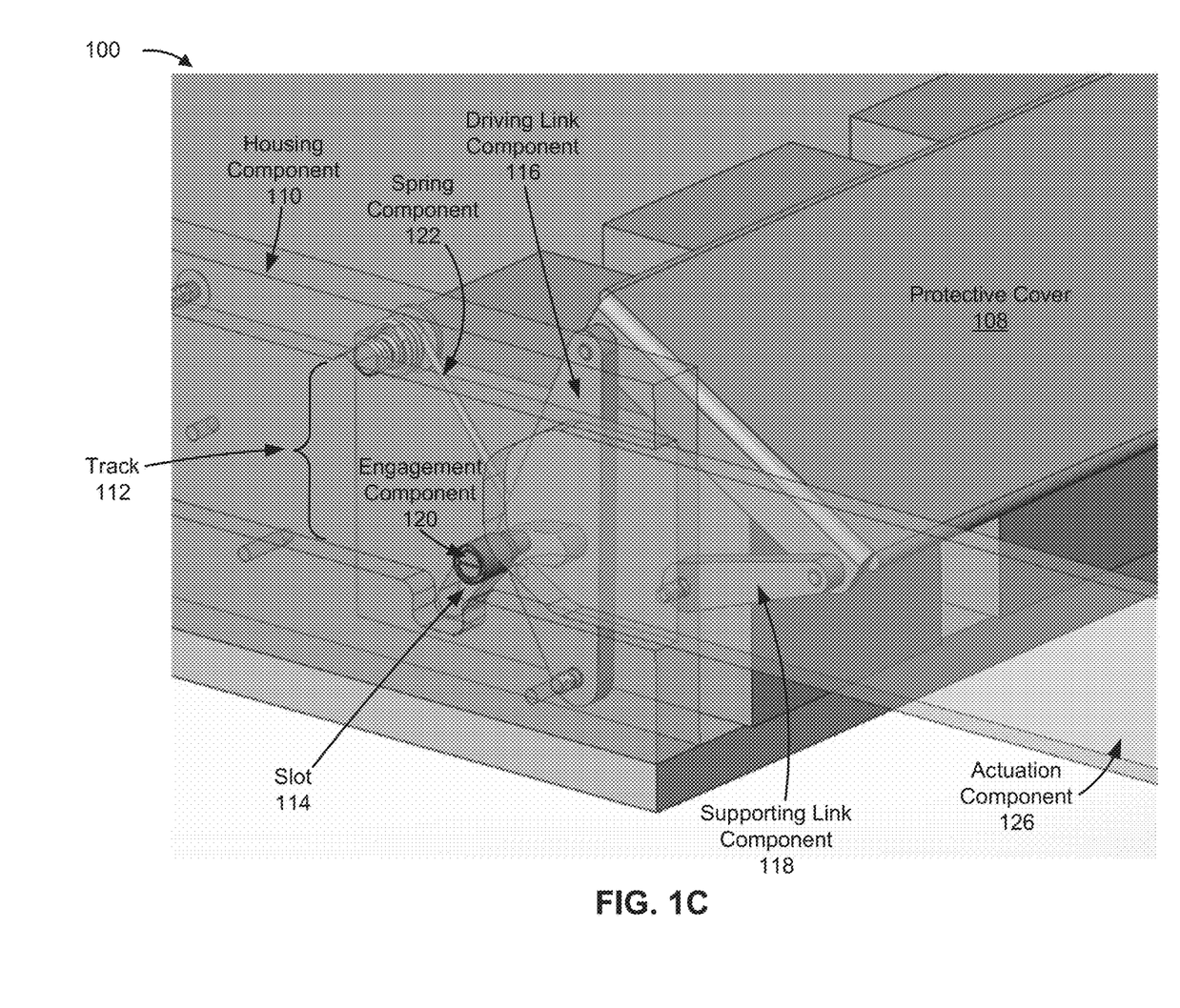

FIGS. 1A-1C are diagrams of one or more example implementations 100 described herein. As shown in FIGS. 1A-1C, an FRU 102 may include one or more connectors 104 and a self-actuating protective cover device 106. The self-actuating protective cover device 106 may include a protective cover 108, a housing component 110 (e.g., that includes a track 112 and/or a slot 114), a driving link component 116, a supporting link component 118, an engagement component 120, and/or a spring component 122.

The FRU 102 may include, for example, one or more power supplies, uplink modules, transceivers, fan trays, packet forwarding engines, routing engines, and/or switching modules. The FRU 102 may be configured to be installed into a network system chassis 124 (e.g., that includes one or more PICs and/or FPCs). Accordingly, the one or more connectors 104 may attach to one or more corresponding connectors of the network system chassis 124 to allow the FRU 102 to be inserted into and installed in the network system chassis 124 (e.g., as shown in FIG. 1B). The one or more connectors 104 may include, for example, one or more electrical connectors (e.g., to provide power to the network system chassis 124), one or more communication connectors (e.g., to facilitate communication by the network system chassis 124), and/or one or more attachment connectors (e.g., to facilitate correct and secure installation of the FRU 102 in the network system chassis 124).

In some implementations, an actuation component 126 may be associated with the network system chassis 124. For example, as shown in FIGS. 1B-1C, the actuation component 126 may be a guide component (e.g., a card guide) for facilitating correct insertion of the FRU 102 into the network system chassis 124, such as by a user (e.g., a network administrator). For example, the user may hold the FRU 102 and align the track 112 of the housing component 110 with the actuation component 126, such that, when the user attempts to insert the FRU 102 into the network system chassis 124, an end of the actuation component 126 inserts into and moves (e.g., slides) within the track 112 of the housing component 110. This facilitates correct insertion (e.g., level insertion and/or insertion into a proper position of the network system chassis 124) of the FRU 102 into the network system chassis 124.

As shown in FIG. 1A, the protective cover 108 of the self-actuating protective cover device 106 may be in a closed position (e.g., positioned over the one or more connectors 104) when the FRU 102 is removed from the network system chassis 124 (and the self-actuating protective cover device 106 is not in contact with the actuation component 126, as further described herein). As shown in FIG. 1B, the protective cover 108 of the self-actuating protective cover device 106 may be in an open positioned (e.g., not positioned over the one or more connectors 104, such as positioned over a top surface of the FRU 102) when the FRU 102 is being inserted (or is fully inserted) into the network system chassis 124 (and one or more components of the self-actuating protective cover device 106 are interacting with the actuation component 126, as further described herein).

Additional details regarding the components and functionality of the self-actuating protective cover device 106 are described herein in relation to FIGS. 2A-2B and 3A-3C. While some implementations are described in relation to the FRU 102 including a single self-actuating protective cover device 106 and interacting with a single actuation component 126, additional implementations are contemplated where the FRU 102 includes multiple self-actuating protective cover devices 106 (e.g., that share a protective cover 108) that interact with multiple actuation components 126. Further, while some implementations are described in relation to the actuation component 126 being associated with the network system chassis 124 (e.g., a guide component for the network system chassis 124), the actuation component 126 may be an independent component (e.g., a tool designed for, and/or utilized by the user, to interact with the self-actuating protective cover device 106).

As indicated above, FIGS. 1A-1C are provided as an example. Other examples may differ from what is described with regard to FIGS. 1A-1C. The number and arrangement of components shown in FIGS. 1A-1C are provided as an example. In practice, there may be additional components, fewer components, different components, or differently arranged components than those shown in FIGS. 1A-1C.

Figure 2A:
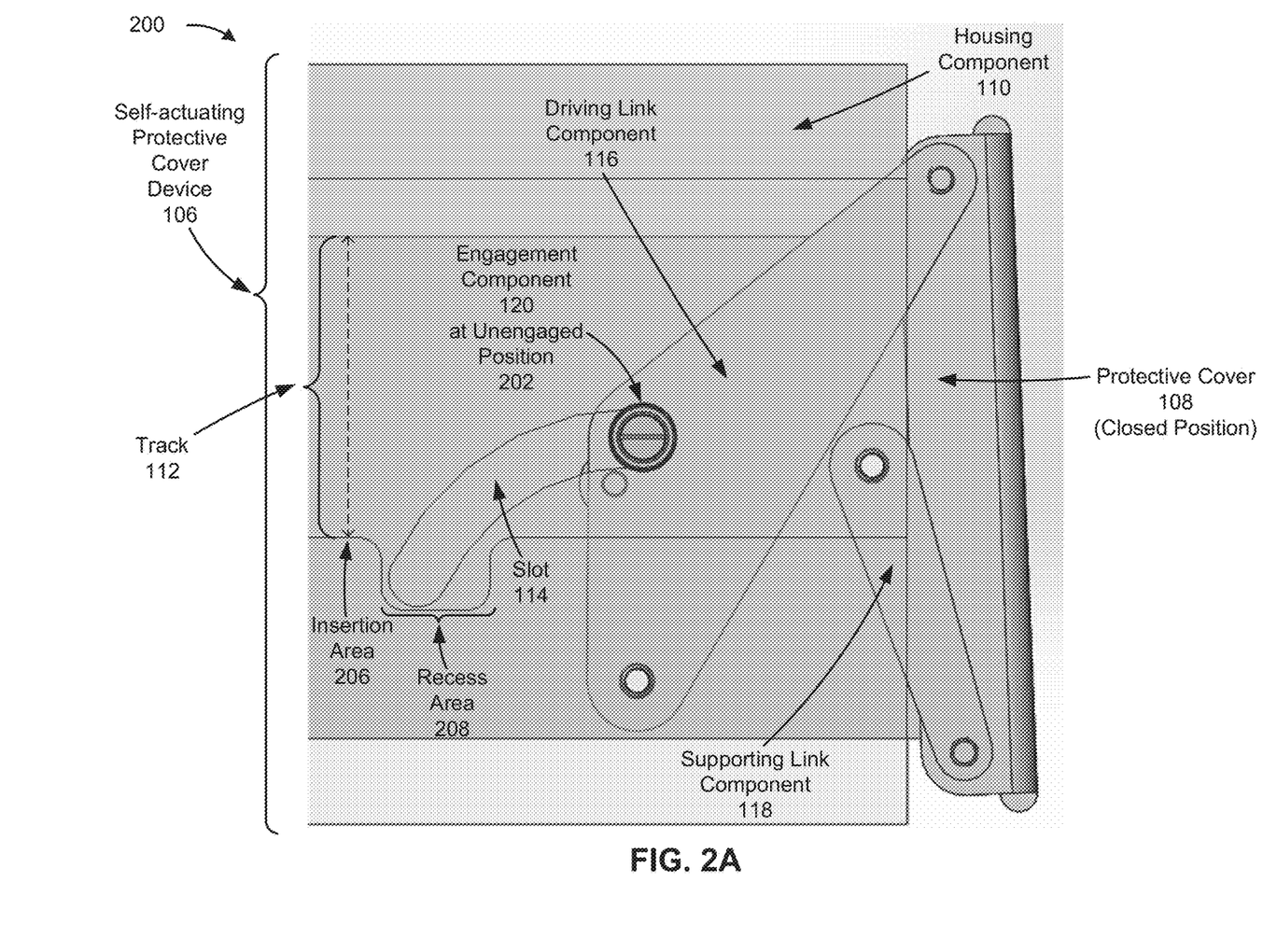
FIGS. 2A-2B are diagrams of one or more example implementations related to a first example configuration of a self-actuating protective cover device described herein.
Figure 2B:
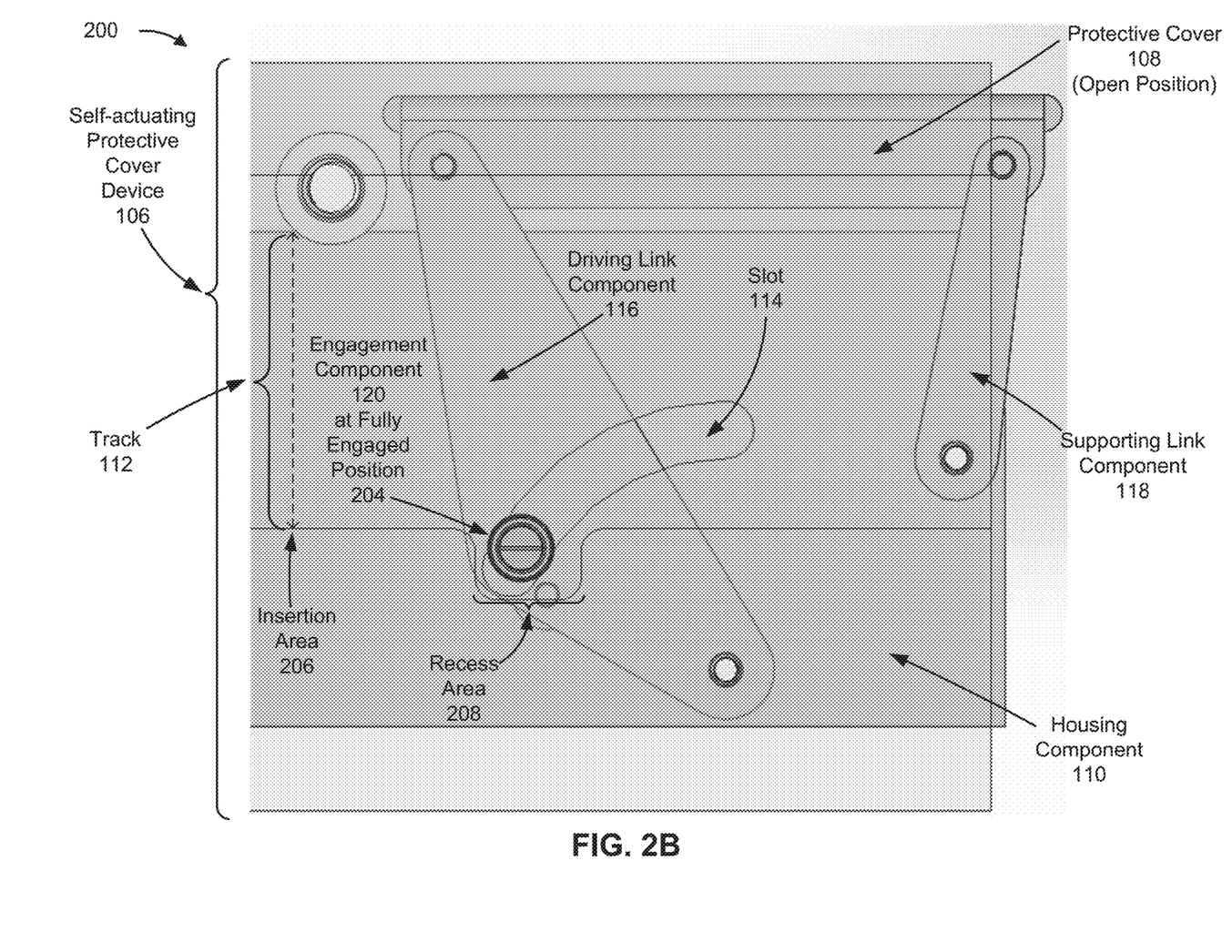

FIGS. 2A-2B are diagrams of one or more example implementations 200 described herein. FIG. 2A is a side view of a portion of the FRU 102 that illustrates a first example configuration of the self-actuating protective cover device 106 when the engagement component 120 is positioned at an unengaged position 202 within the slot 114 of the housing component 110 (and the protective cover 108 is in a closed position). FIG. 2B is a side view of the portion of the FRU 102 that illustrates the first example configuration of the self-actuating protective cover device 106 when the engagement component 120 is positioned at a fully engaged position 204 within the slot 114 of the housing component 110 (and the protective cover 108 is in an open position).

As further shown in FIGS. 2A-2B, in the first example configuration, the self-actuating protective cover device 106 may include the protective cover 108, the housing component 110 (e.g., that includes the track 112 and/or the slot 114), the driving link component 116, the supporting link component 118, and/or the engagement component 120. The protective cover 108 may be configured to protect the one or more connectors 104 when the protective cover 108 is positioned over the one or more connectors 104 (e.g., as shown in FIG. 1A when the protective cover 108 is in a closed position). The protective cover 108 may comprise a metal, a plastic, or another material.

The housing component 110 may be configured to provide structural support to the FRU 102 and may comprise a metal, a plastic, or another material. The housing component 110 may comprise a side surface of the FRU 102 (e.g., when the one or more connectors 104 are disposed on a front surface of the FRU 102, such as shown in FIGS. 1A-1C). The housing component 110 may include the track 112, which may be configured to allow movement of an end of the actuation component 126 within the track 112. For example, the track 112 may include an insertion area 206 (e.g., that is defined by side rails of the track 112) in which the actuation component 126 is to insert into and move (e.g., slide) within.

Additionally, or alternatively, the housing component 110 may include the slot 114, which may be configured to allow movement of the engagement component 120 within the slot 114. For example, as shown in FIGS. 2A-2B, the slot 114 (shown as having an arc-shape) may allow the engagement component 120 to move from the unengaged position 202 to the fully engaged position 204 (e.g., as further described herein). In some implementations, a portion of the slot 114 may be coextensive with the insertion area 206 (e.g., such that the unengaged position 202 within the slot 114 is located within the insertion area 206). For example, as shown in FIGS. 2A-2B, a top portion of the slot 114 may be coextensive with the insertion area 206, such that, when an end of the actuation component 126 inserts into the track 112, the end of the actuation component 126 contacts the engagement component 120 and moves (e.g., pushes) the engagement component 120 from the unengaged position 202 to one or more other positions within the slot 114. Additionally, or alternatively, another portion of the slot 114 may not be coextensive with the insertion area 206 (e.g., such that the fully engaged position 204 within the slot 114 is located outside the insertion area 206). For example, as shown in FIGS. 2A-2B, a bottom portion of the slot 114 may not be coextensive with the insertion area 206 (e.g., the bottom portion may be coextensive with a recess area 208 associated with the track 112), such that, when the end of the actuation component 126 inserts into the track 112, the end of the actuation component 126 contacts the engagement component 120 and moves (e.g., pushes) the engagement component 120 to the fully engaged position 204 (e.g., within the recess area 208) and out of the insertion area 206 of the track 112 (e.g., to allow the actuation component 126 to continue inserting into the track 112).

The engagement component 120 may comprise a pin, a bolt, a knob, or another structure that is configured to move (e.g., slide) within the slot 114. In some implementations, the engagement component 120 may include a rolling portion (e.g., that is to contact the end of the actuation component 126). For example, the engagement component 120 may comprise a track-roller or another structure with a rolling portion. In this way, when the end of the actuation component 126 inserts into the track 112, the end of the actuation component 126 may contact more than just a single region of the engagement component 120, thereby reducing wear on the particular region of the engagement component 120 and/or the end of the actuation component 126 (and thus increasing an operating life of the engagement component 120 and/or the actuation component 126).

The driving link component 116 may be attached (e.g., pivotally attached) to the protective cover 108 and the housing component 110. For example, as shown in FIGS. 2A-2B, a first end of the driving link component 116 may be attached to a first end of the protective cover 108 (e.g., a first end of a side component of the protective cover 108) and/or a second end of the driving link component 116 may be attached to the housing component 110. The supporting link component 118 may be attached (e.g., pivotally attached) to the protective cover 108 and the housing component 110. For example, as shown in FIGS. 2A-2B, a first end of the supporting link component 118 may be attached to a second end of the protective cover 108 (e.g., a second end of the side component of the protective cover 108) and/or a second end of the supporting link component 118 may be attached to the housing component 110.

The engagement component 120 may be attached to the driving link component 116 (e.g., to a portion of the driving link component 116 that is not associated with the first end and the second end of the driving link component 116). For example, as shown in FIGS. 2A-2B, the driving link component 116 may have a triangular shape, wherein a first corner (e.g., the first end) of the driving link component 116 is attached to the protective cover 108, a second corner (e.g., the second end) of the driving link component 116 is attached to the housing component 110, and a third corner (e.g., a third end) of the driving link component 116 is attached to the engagement component 120.

In some implementations, the engagement component 120 may be configured to move (e.g., slide) within the slot 114 of the housing component 110. For example, the engagement component 120 may be configured to move within the slot 114 when the end of the actuation component 126 moves within the track 112 of the housing component 110 and contacts (e.g., pushes) the engagement component 120. Accordingly, the engagement component 120 may be configured to cause the driving link component 116, the supporting link component 118, and the protective cover 108 to move when the engagement component 120 moves within the slot 114 of the housing component 110 (e.g., because the engagement component 120, the driving link component 116, the supporting link component 118, and the protective cover 108 are linked).

In some implementations, the engagement component 120 may be configured to be positioned at the unengaged position 202 within the slot 114 (e.g., when the engagement component 120 is not in contact with the end of the actuation component 126). Accordingly, as shown in FIG. 2A, the engagement component 120 being positioned at the unengaged position 202 may cause the driving link component 116, the supporting link component 118, and the protective cover to be placed in a closed positional arrangement. Thus, when the engagement component 120 is positioned at the unengaged position 202 within the slot 114, the protective cover 108 may be positioned over the one or more connectors 104 of the FRU 102, such as in the closed position shown in FIG. 2A (e.g., that corresponds to the closed position shown in FIG. 1A).

Figure 3A:
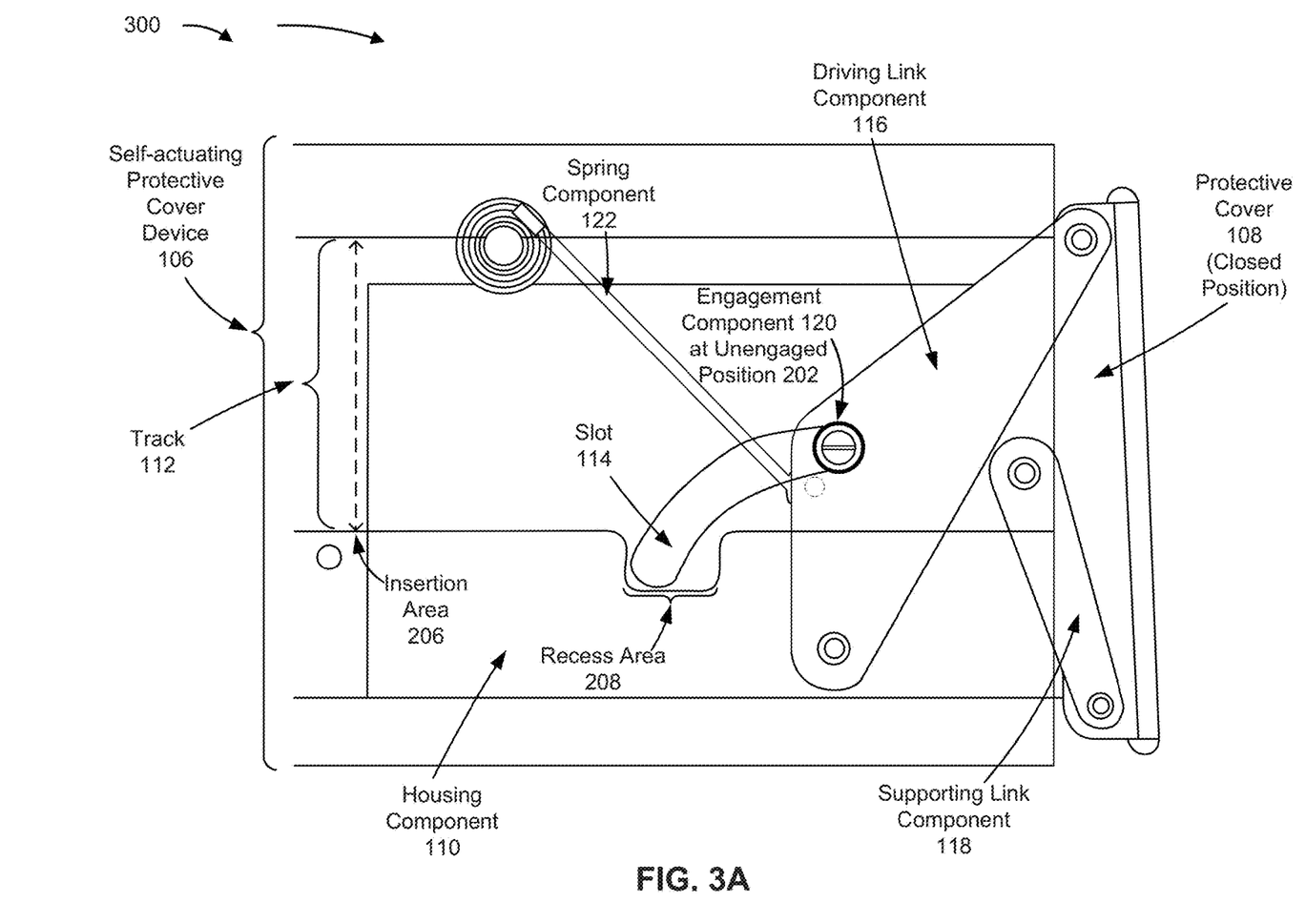
FIGS. 3A-3C are diagrams of one or more example implementations related to a second example configuration of the self-actuating protective cover device described herein
Figure 3B:
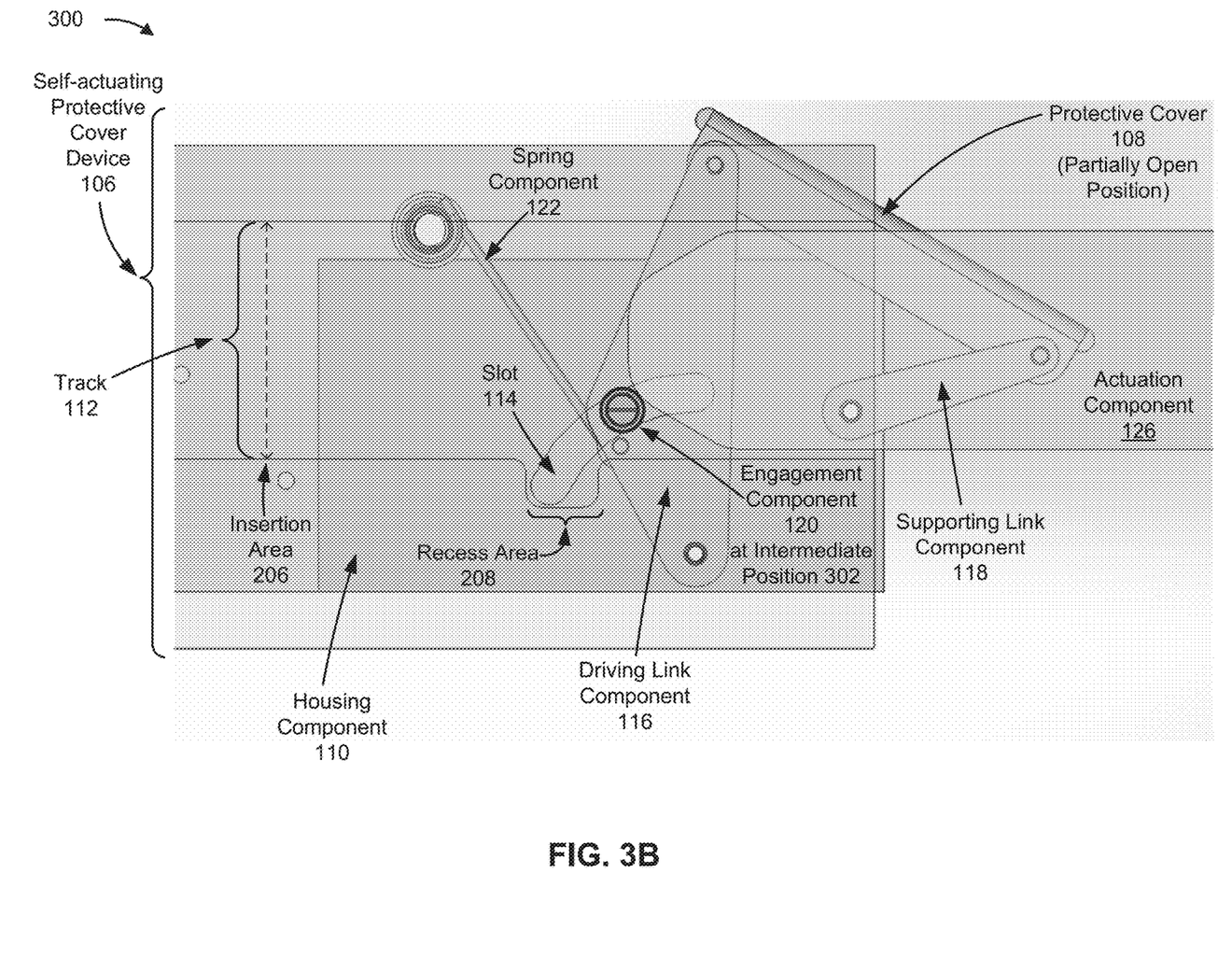
Figure 3C:
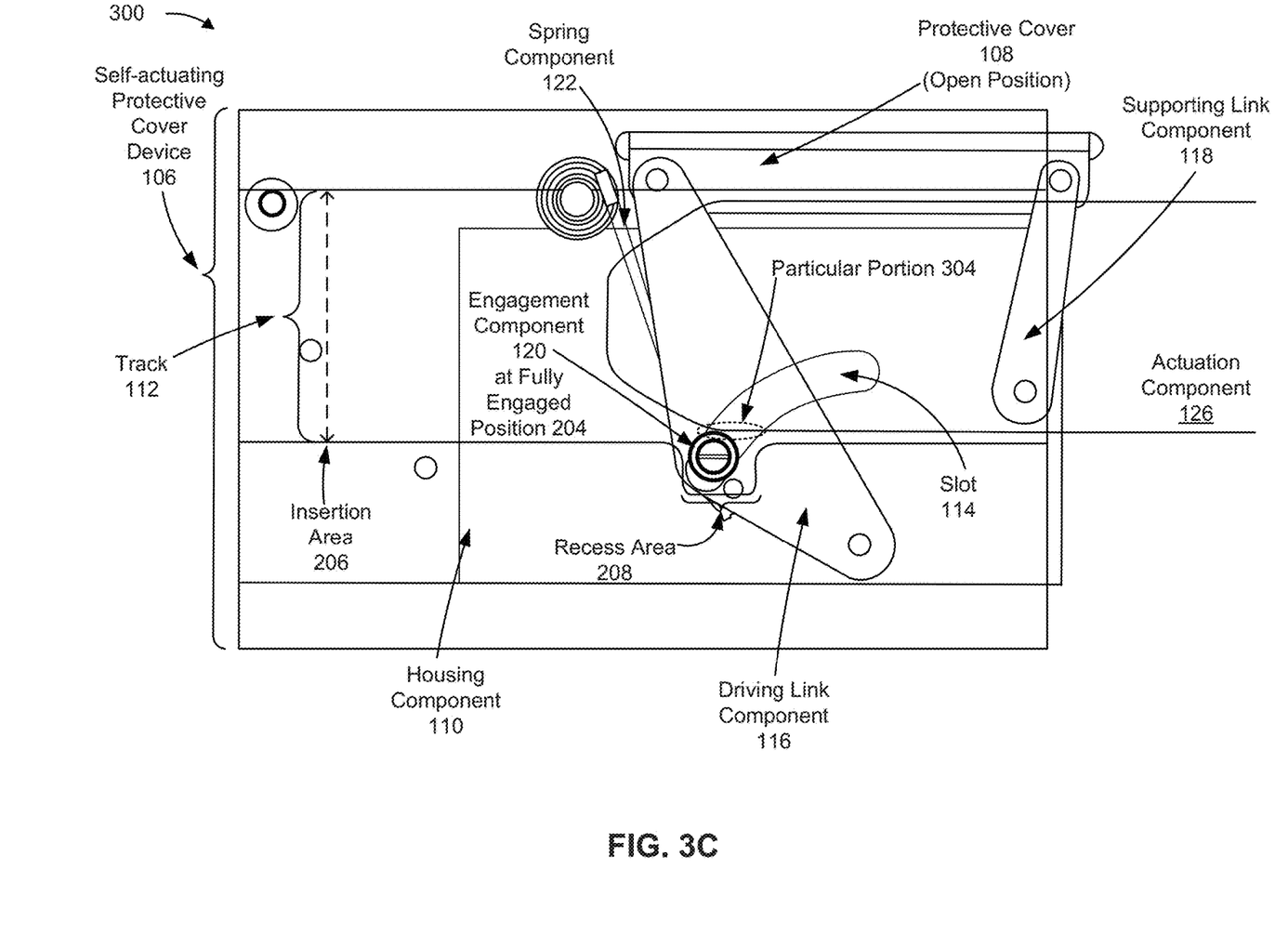

In some implementations, the engagement component 120 may be configured to be positioned at the fully engaged position 204 within the slot 114 (e.g., when the engagement component 120 is in contact with the end of the actuation component 126 and a threshold amount of the end of the actuation component 126 is inserted into the track 112 of the housing component 110, such that the engagement component 120 is in contact with a particular portion of the end of the actuation component 126, as described herein in relation to FIG. 3C). Accordingly, as shown in FIG. 2B, the engagement component 120 being positioned at the fully engaged position 204 may cause the driving link component 116, the supporting link component 118, and the protective cover to be placed in an open positional arrangement. Thus, when the engagement component 120 is positioned at the fully engaged position 204 within the slot 114, the protective cover 108 may not be positioned over the one or more connectors 104 of the FRU 102 and may rather be in the open position shown in FIG. 2B (e.g., that corresponds to the open position shown in FIG. 1B).

As indicated above, FIGS. 2A-2B are provided as an example. Other examples may differ from what is described with regard to FIGS. 2A-2B. The number and arrangement of components shown in FIGS. 2A-2B are provided as an example. In practice, there may be additional components, fewer components, different components, or differently arranged components than those shown in FIGS. 2A-2B.

FIGS. 3A-3C are diagrams of one or more example implementations 300 described herein. FIG. 3A is a side view of a portion of the FRU 102 that illustrates a second example configuration of the self-actuating protective cover device 106 when the engagement component 120 is positioned at the unengaged position 202 within the slot 114 of the housing component 110 (and the protective cover 108 is in a closed position). FIG. 3B is a side view of the portion of the FRU 102 that illustrates the second example configuration of the self-actuating protective cover device 106 when the engagement component 120 is positioned at an intermediate position 302, between the unengaged position 202 and the fully engaged position 204, within the slot 114 of the housing component 110 (and the protective cover 108 is in a partially open position). FIG. 3C is the side view of a portion of the FRU 102 that illustrates the second example configuration of the self-actuating protective cover device 106 when the engagement component 120 is positioned at the fully engaged position 204 within the slot 114 of the housing component 110 (and the protective cover 108 is in an open position).

As further shown in FIGS. 3A-3C, in the second example configuration, the self-actuating protective cover device 106 may include the protective cover 108, the housing component 110 (e.g., that includes the track 112 and/or the slot 114), the driving link component 116, the supporting link component 118, the engagement component 120, and/or the spring component 122 (e.g., the second example configuration of the self-actuating protective cover device 106 may include the spring component 122, while the first example configuration of the self-actuating protective cover device 106 may not). Accordingly, the protective cover 108, the housing component 110 (e.g., that includes the track 112 and/or the slot 114), the driving link component 116, the supporting link component 118, and/or the engagement component 120 may be configured in a same, or similar, manner as elsewhere described herein (e.g., in relation to FIGS. 1A-1C and 2A-2B).

As shown in FIGS. 3A-3C, the spring component 122 may be attached to the housing component 110 and the driving link component 116. The spring component 122 may be a torsion spring, a coil spring, an extension spring, a retainer spring, or a spring clip, among other examples. Accordingly, the spring component 122 may be configured to affect movement of the engagement component 120 within the slot 114 (e.g., because the spring component 122 and the engagement component 120 are attached to the driving link component 116). In some implementations, the spring component 122 may be configured to resist movement of the engagement component 120. For example, the spring component 122 may be configured to resist movement of the engagement component 120 (e.g., from the unengaged position 202 within the slot 114), such as when the end of the actuation component 126 is being inserted into the track 112 (e.g., as shown in FIGS. 3B-3C). In this way, the spring component 122 may prevent inadvertent opening of the protective cover 108 (e.g., due to handling of the FRU 102 that is not associated with inserting the FRU 102 into the network system chassis 124). As another example, the spring component 122 may be configured to cause the engagement component 120 to be positioned (e.g., to remain positioned) at the unengaged position 202 within the slot 114, such as when the engagement component 120 is not in contact with the actuation component 126 (e.g., the end of the actuation component 126). In this way, the spring component 122 may cause the protective cover 108 to remain in a closed position (e.g., unless the actuation component 126 is inserted into the track 112 of the housing component 110).

FIGS. 3A-3C further show positional arrangements of components of the self-actuating protective cover device 106 based on interactions with the actuation component 126.

FIG. 3A shows when the actuation component 126 is not inserted (e.g., before insertion) into the track 112 of the housing component 110 (and/or is otherwise not interacting with the self-actuating protective cover device 106). Accordingly, as shown in FIG. 3A, the engagement component 120 may be positioned at the unengaged position 202 within the slot 114 (e.g., because the engagement component 120 is not in contact with the end of the actuation component 126). This causes, as further shown in FIG. 3A, the driving link component 116, the supporting link component 118, and the protective cover to be placed in a closed positional arrangement. Thus, when the engagement component 120 is positioned at the unengaged position 202 within the slot 114, the protective cover 108 may be positioned over the one or more connectors 104 of the FRU 102, such as in the closed position shown in FIG. 3A (e.g., that corresponds to the closed position shown in FIG. 1A).

FIG. 3B shows when the actuation component 126 is initially inserted into the track 112 of the housing component 110 (e.g., the end the actuation component 126 has contacted the engagement component 120 and caused the engagement component 120 to move within the slot 114 from the unengaged position 202). Accordingly, as shown in FIG. 3B, the engagement component 120 may be positioned at the intermediate position 302 within the slot 114 (e.g., between the unengaged position 202 and the fully engaged position 204 within the slot 114). This causes, as further shown in FIG. 3B, the driving link component 116, the supporting link component 118, and the protective cover to be placed in a partially open positional arrangement. Thus, when the engagement component 120 is positioned at the intermediate position 302 within the slot 114, the protective cover 108 may be partially positioned over the one or more connectors 104 of the FRU 102, such as in the partially open position shown in FIG. 3B. In some implementations, the engagement component 120 may be positioned at the intermediate position 302 within the slot 114 when the actuation component 126 is being removed from the track 112 of the housing component 110 (e.g., because the spring component 122 causes the engagement component 120 to resist movement of the engagement component 120 away from the unengaged position 202).

FIG. 3C shows when a threshold amount of the end of the actuation component is inserted into the track 112 of the housing component 110, such that a particular portion 304 (e.g., a bottom portion) of the end of the actuation component 126 contacts the engagement component 120 and causes the engagement component 120 to move within the slot 114 to the fully engaged position 204. Accordingly, as shown in FIG. 3C, the engagement component 120 may be positioned at the fully engaged position 204 within the slot 114. This causes, as further shown in FIG. 2A, the driving link component 116, the supporting link component 118, and the protective cover to be placed in an open positional arrangement. Thus, when the engagement component 120 is positioned at the fully engaged position 204 within the slot 114, the protective cover 108 may not be positioned over the one or more connectors 104 of the FRU 102 and may rather be positioned in the open position shown in FIG. 3C (e.g., that corresponds to the open position shown in FIG. 1B).

As indicated above, FIGS. 3A-3C are provided as an example. Other examples may differ from what is described with regard to FIGS. 3A-3C. The number and arrangement of components shown in FIGS. 3A-3C are provided as an example. In practice, there may be additional components, fewer components, different components, or differently arranged components than those shown in FIGS. 3A-3C.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A field-replaceable unit (FRU), comprising:
   one or more connectors; and
   a self-actuating protective cover device that includes:
   a protective cover to protect the one or more connectors when the protective cover is positioned over the one or more connectors,
   a housing component that includes a track and a slot, wherein:
   the track is to allow movement of an end of an actuation component within the track, and
   the slot is to allow movement of an engagement component within the slot,
   a driving link component, wherein:
   a first end of the driving link component is attached to a first end of the protective cover, and
   a second end of the driving link component is attached to the housing component,
   a supporting link component, wherein:
   a first end of the supporting link component is attached to a second end of the protective cover, and
   a second end of the supporting link component is attached to the housing component of the FRU, and
   the engagement component, wherein:
   the engagement component is to move within the slot of the housing component when the end of the actuation component moves within the track of the housing component and contacts the engagement component,
   the engagement component is attached to a portion of the driving link component, and
   the engagement component is to cause the driving link component, the supporting link component, and the protective cover to move when the engagement component moves within the slot of the housing component.

2. The FRU of claim 1, wherein:
   the engagement component is to be positioned at an unengaged position within the slot of the housing component when the engagement component is not in contact with the end of the actuation component, and
   the engagement component being positioned at the unengaged position is to cause the driving link component, the supporting link component, and the protective cover to be placed in a closed positional arrangement, wherein the protective cover is to be positioned over the one or more connectors when the protective cover is in the closed positional arrangement.

3. The FRU of claim 1, wherein:
the engagement component is to be positioned at a fully engaged position within the slot of the housing component when the engagement component in contact with the end of the actuation component and a threshold amount of the end of the actuation component is inserted into the track of the housing component, and
the engagement component being positioned at the fully engaged position is to cause the driving link component, the supporting link component, and the protective cover to be placed in an open positional arrangement,
wherein the protective cover is to not be positioned over the one or more connectors when the protective cover is in the open positional arrangement.

4. The FRU of claim 1, wherein:
the engagement component is to be positioned at an unengaged position within the slot of the housing component when the engagement component is not in contact with the end of the actuation component,
wherein the unengaged position is located within an insertion area of the track of the housing component; and
the engagement component is to be positioned at a fully engaged position within the slot of the housing component when the engagement component is in contact with the end of the actuation component and a threshold amount of the end of the actuation component is inserted into the track of the housing component,
wherein the fully engaged position is located outside the insertion area of the track of the housing component.

5. The FRU of claim 1, wherein the self-actuating protective cover device further includes:
a spring component that is attached to the housing component and the driving link component,
wherein the spring component is to resist movement of the engagement component by the end of the actuation component when the end of the actuation component is being inserted into the track of the housing component.

6. The FRU of claim 1, wherein the self-actuating protective cover device further includes:
a spring component that is attached to the housing component and the driving link component,
wherein the spring component is to cause the engagement component to be positioned at an unengaged position within the slot of the housing component when the engagement component is not in contact with the end of the actuation component.

7. The FRU of claim 1, wherein the engagement component includes a rolling portion that is to contact the end of the actuation component.

8. A field-replaceable unit (FRU), comprising:
a self-actuating protective cover device that includes:
a protective cover,
a housing component that includes a slot,
a driving link component attached to the protective cover and the housing component,
a supporting link component attached to the protective cover and the housing component, and
an engagement component attached to the driving link component, wherein:
the engagement component is to move within the slot of the housing component, and
the engagement component is to cause the driving link component, the supporting link component, and the protective cover to move when the engagement component moves within the slot of the housing component.

9. The FRU of claim 8, wherein:
the engagement component is to be positioned at an unengaged position within the slot of the housing component when the engagement component is not in contact with an actuation component, and
the engagement component being positioned at the unengaged position is to cause the driving link component, the supporting link component, and the protective cover to be placed in a closed positional arrangement,
wherein the protective cover is to be positioned over one or more connectors of the FRU when the protective cover is in the closed positional arrangement.

10. The FRU of claim 8, wherein:
the engagement component is to be positioned at a fully engaged position within the slot of the housing component when the engagement component is in contact with a particular portion of an end of an actuation component, and
the engagement component being positioned at the fully engaged position is to cause the driving link component, the supporting link component, and the protective cover to be placed in an open positional arrangement,
wherein the protective cover is to not be positioned over one or more connectors of the FRU when the protective cover is in the open positional arrangement.

11. The FRU of claim 8, wherein:
the engagement component is to be positioned at an unengaged position within the slot of the housing component when the engagement component is not in contact with an end of an actuation component,
wherein the protective cover is to be positioned over one or more connectors of the FRU when the engagement component is positioned at the unengaged position; and
the engagement component is to be positioned at a fully engaged position within the slot of the housing component when the engagement component is in contact with a particular portion of the end of the actuation component,
wherein the protective cover is to not be positioned over the one or more connectors of the FRU when the engagement component is positioned at the fully engaged position.

12. The FRU of claim 8, wherein the self-actuating protective cover device further includes:
a spring component that is attached to the housing component and the driving link component,
wherein the spring component is to resist movement of the engagement component from an unengaged position within the slot of the housing component.

13. The FRU of claim 8, wherein the self-actuating protective cover device further includes:
a spring component that is attached to the housing component and the driving link component,
wherein the spring component is to cause the engagement component to be positioned at an unengaged position within the slot of the housing component when the engagement component is not in contact with an actuation component.

14. The FRU of claim 8, wherein the housing component further includes a track to allow movement of an end of an actuation component within the track, and wherein the engagement component is to move within the slot of the housing component when the end of the actuation component moves within the track of the housing component and contacts the engagement component.

15. A self-actuating protective cover device for a field-replaceable unit (FRU), comprising:
   a protective cover;
   a housing component that includes a slot;
   a supporting link component attached to the protective cover and the housing component, and
   an engagement component, wherein:
      the engagement component is to be engaged by an actuation component of a mating connector and caused to move within the slot of the housing component, and
      the engagement component is to cause the supporting link component and the protective cover to move when the engagement component moves within the slot of the housing component.

16. The self-actuating protective cover device of claim 15, wherein the protective cover is to be positioned over one or more connectors of the FRU when the engagement component is positioned at an unengaged position within the slot of the housing component.

17. The self-actuating protective cover device of claim 16, wherein the engagement component is to be positioned at the unengaged position within the slot of the housing component when the engagement component is not in contact with an end of an actuation component.

18. The self-actuating protective cover device of claim 15, wherein the protective cover is to not be positioned over one or more connectors of the FRU when the engagement component is positioned at a fully engaged position within the slot of the housing component.

19. The self-actuating protective cover device of claim 18, wherein the engagement component is to be positioned at the fully engaged position within the slot of the housing component when the engagement component is in contact with a particular portion of an end of an actuation component.

20. The self-actuating protective cover device of claim 15, wherein the self-actuating protective cover device further includes a spring component that is to at least one of:
   resist movement of the engagement component from an unengaged position within the slot of the housing component; or
   cause the engagement component to be positioned at the unengaged position within the slot of the housing component when the engagement component is not in contact with an actuation component.

* * * * *